United States Patent
Noda

(10) Patent No.: US 8,053,337 B2
(45) Date of Patent: Nov. 8, 2011

(54) METHOD OF MANUFACTURING SEMICONDUCTOR DEVICE

(75) Inventor: Takamitsu Noda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/659,991

(22) Filed: Mar. 26, 2010

(65) Prior Publication Data

US 2010/0273312 A1 Oct. 28, 2010

(30) Foreign Application Priority Data

Apr. 22, 2009 (JP) ................. 2009-104554

(51) Int. Cl.
*H01L 21/78* (2006.01)

(52) U.S. Cl. ............ 438/462; 257/E21.599; 438/463; 438/465; 438/976

(58) Field of Classification Search ........... 257/E21.599; 438/462, 463, 465, 976
See application file for complete search history.

(56) References Cited

U.S. PATENT DOCUMENTS

| | | | | | |
|---|---|---|---|---|---|
| 5,157,001 | A | * | 10/1992 | Sakuma | 438/465 |
| 5,817,569 | A | * | 10/1998 | Brenner et al. | 438/460 |
| 6,042,922 | A | * | 3/2000 | Senoo et al. | 428/66.6 |
| 6,063,696 | A | * | 5/2000 | Brenner et al. | 438/465 |
| 6,383,893 | B1 | * | 5/2002 | Begle et al. | 438/460 |
| 7,772,092 | B2 | * | 8/2010 | Iizuka et al. | 438/463 |
| 2006/0068567 | A1 | * | 3/2006 | Beyne et al. | 438/460 |
| 2006/0154449 | A1 | * | 7/2006 | Kobayashi | 438/462 |
| 2008/0191318 | A1 | * | 8/2008 | Su et al. | 257/620 |
| 2008/0277765 | A1 | * | 11/2008 | Lane et al. | 257/622 |
| 2010/0207250 | A1 | * | 8/2010 | Su et al. | 257/620 |

FOREIGN PATENT DOCUMENTS

| | | |
|---|---|---|
| JP | 2005-166890 | 6/2005 |
| JP | 2006-73910 | 3/2006 |
| JP | 2007-173325 | 7/2007 |
| JP | 2008-130886 | 6/2008 |

* cited by examiner

*Primary Examiner* — Asok Sarkar
(74) *Attorney, Agent, or Firm* — McGinn IP Law Group, PLLC

(57) ABSTRACT

In a method of manufacturing a semiconductor device, a first groove and a second groove each having a width less than that of a scribe line are formed along the scribe line in a first protective film provided below a second protective film which protects element forming regions when a wafer is divided into parts by a laser dicing, and the first groove and the second groove are filled with the second protective film. Then, the laser dicing is performed on a region between the first groove and the second groove along the scribe line from the surface where the second protective film is formed to form a cutting groove that reaches at least a predetermined depth of the multi-layer interconnect.

17 Claims, 12 Drawing Sheets

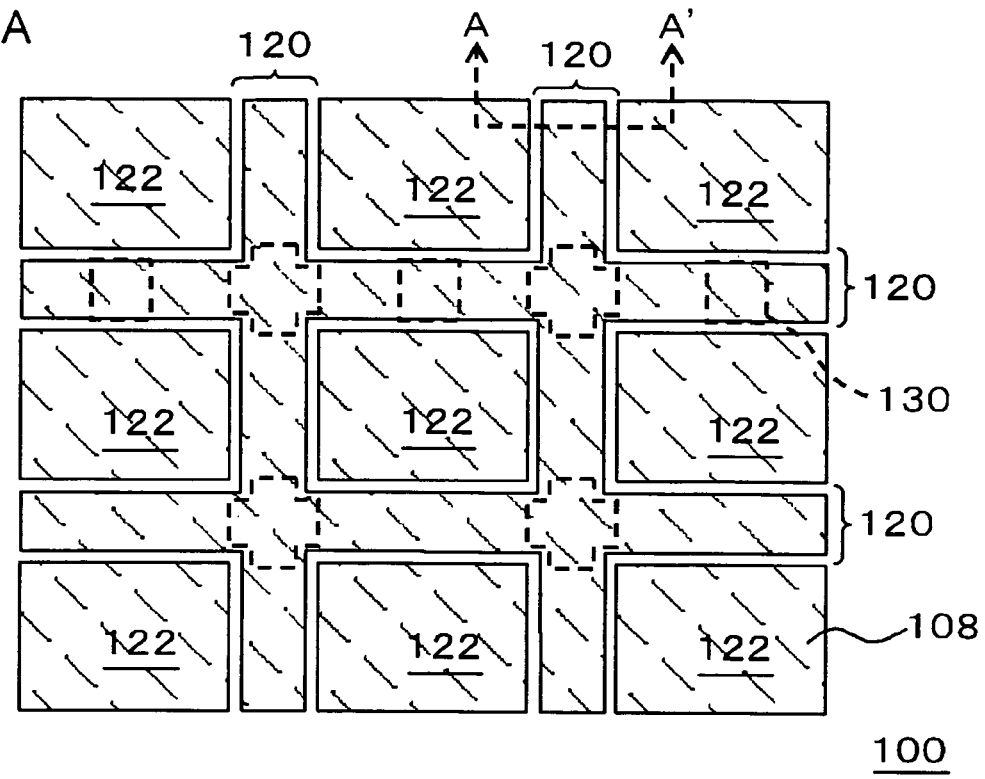
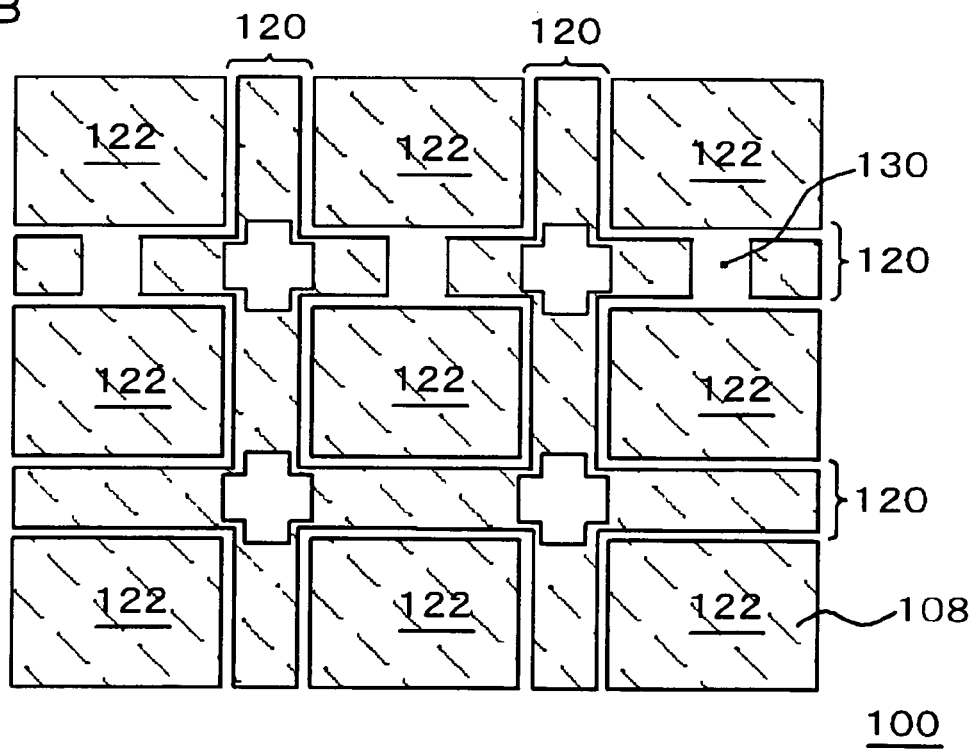

METHOD OF MANUFACTURING SEMICONDUCTOR DEVICE

The application is based on Japanese patent application No. 2009-104554, the content of which is incorporated hereinto by reference.

BACKGROUND

1. Technical Field

The present invention relates to a method of manufacturing a semiconductor device and more particularly, to a method of manufacturing a semiconductor device including performing laser dicing to form a cutting groove in a multi-layer interconnect.

2. Related Art

In a process of manufacturing a semiconductor device, after a multi-layer interconnect is formed on a wafer, the wafer is diced into individual semiconductor chips. In the related art, the wafer is diced into semiconductor chips by a blade. However, in recent years, a low-dielectric-constant film, particularly, a porous film has been used as an insulating interlayer of the multi-layer interconnect. Since the porous film has low adhesion and low mechanical strength, the porous film peels off during dicing with the blade. Therefore, in recent years, a method has been used in which grooves are formed in the porous film and a portion of the surface of the wafer by laser dicing using laser light and the other portion of the wafer is diced by the blade.

Japanese Unexamined patent publication No. 2006-073910 discloses a structure in which an insulating protective film made of a polyimide resin is formed over portions other than electrodes and an oxide film is formed as the base of a cutting surface that is not sufficiently protected by the protective film. In this way, it is disclosed that it is possible to improve the covering performance of the protective film and prevent chipping in the use of a laser dicing machine.

Japanese Unexamined patent publication No. 2007-173325 discloses an apparatus for manufacturing a semiconductor device including a passivation film that covers a semiconductor integrated circuit and a scribe region. In this document, in order to reduce the warpage of a semiconductor substrate caused by the passivation film, grooves are formed in a lattice shape in the passivation film that is provided on the scribe region.

Japanese Unexamined patent publication No. 2005-166890 discloses a structure in which various films are formed on the surface of a chip invalid region and a polyimide film, which is used as a protective film, is removed among the various films in a process of manufacturing a semiconductor device.

In general, a polyimide film, a kind of protective film, is formed as the uppermost layer of a multi-layer interconnect that is formed on a wafer. However, openings are formed in a portion of the polyimide film and elements, such as electrode pads, are exposed through the openings. Therefore, when the polyimide film is cut by laser light along scribe lines, a scattered material adheres to elements, such as electrodes. In order to solve this problem, a method has been proposed in which a protective film that can be removed by a cleaning solution in the subsequent process is formed on the polyimide film provided on the surface of a multi-layer interconnect so as to cover the entire surface of the wafer and the protective film is cut by laser light from the upper side of the protective film (Japanese Unexamined patent publication No. 2008-130886).

However, even though the protective film is formed in this way, the protective film peels off during a dicing operation with laser light and a scattered material adheres to the elements, which will be described with reference to FIGS. 11A to 12C.

FIGS. 11A to 11C are cross-sectional views schematically illustrating a process of manufacturing a semiconductor device 10. FIGS. 12A to 12C are enlarged views illustrating around the scribe line shown in FIGS. 11A to 11C after a protective film 20 is formed.

The semiconductor device 10 includes a multi-layer interconnect 14 and a polyimide film 18 formed on a wafer 12. In recent years, before a cutting process with laser light is performed, the polyimide film 18 remains on the entire surface of the scribe line, only the region in which, for example, an alignment mark or metal for checking electric characteristics is formed is removed, or the polyimide film on the entire surface of the scribe line is opened, as described in Japanese Unexamined patent publication No. 2005-166890. Here, the structure in which the polyimide film 18 on the entire surface of the scribe line is opened to form a scribe line groove 18a is shown. The protective film 20 is coated on the entire surface of the semiconductor device 10 by a spin coating method. Specifically, the semiconductor device 10 is arranged on a dicing sheet 50, and a protective film application stage (not shown) is loaded with the dicing sheet 50 around the semiconductor device 10 fixed by a ring 52. Then, liquid droplets forming the protective film 20 are dropped from nozzles 54 onto the semiconductor device 10 while the protective film application stage is being rotated, thereby forming the protective film 20 on the entire surface of the semiconductor device 10 (FIGS. 11A and 12A).

Then, laser light 60 is radiated along the scribe line of the semiconductor device 10 having the above-mentioned structure to cut the protective film 20, the multi-layer interconnect 14, and a portion of the wafer 12, thereby forming cutting grooves 10a (FIGS. 11B and 12B). Then, a cleaning solution 72 is supplied from nozzles 70 to the semiconductor device 10 while the dicing sheet 50 is being rotated, thereby cleaning the surface of the semiconductor device 10. During a cutting process with the laser light 60, a scattered material is generated from a member to be cut. However, when the surface of the semiconductor device 10 is covered with the protective film 20, the scattered material is deposited on the protective film 20. Then, the scattered material and the protective film 20 are cleaned by the cleaning solution 72 (FIG. 11C).

However, in the related art, there is an uneven portion in the polyimide film 18, and it is difficult to control uniformity of the thickness of the protective film 20 while following the uneven portion.

When the protective film 20 is formed on the polyimide film 18, there is a step portion, such as the scribe line groove 18a or a pad opening, in the surface of the polyimide film 18, which results in a difference in thickness. In regions other than the opening, the thickness is small, for example, in the range of about 0.1 μm to about 3 μm. The scribe line has a large width of, for example, about 100 μm. Therefore, even when the polyimide film 18 on the entire surface of the scribe line is removed, the thickness of the protective film 20 on the scribe line groove 18a is reduced (FIG. 12A).

In general, the laser absorption ratio of the wafer 12 or the multi-layer interconnect 14 is higher than that of the protective film 20. Therefore, when the semiconductor device 10 is cut by the laser light 60, the protective film 20 is likely to be peeled off by the abrasion of the multi-layer interconnect 14 or the wafer 12 due to the laser light 60 (FIG. 12B). FIG. 12B shows an example in which two portions are cut along the scribe line to form two cutting grooves 10a. As such, when the protective film 20 peels off, a scattered material 24 is adhered to the peeled-off portion. In this case, when the protective film 20 is cleaned by the cleaning solution 72 (see FIG. 11C), it is difficult to clean the scattered material 24 (FIG. 12C). When the scattered material 24 is adhered to the upper surface of the polyimide film 18 or a bonding part, such as a bonding pad, yield is lowered or the reliability of the package is lowered.

SUMMARY

In one embodiment of the invention, there is provided a method of manufacturing a semiconductor device including: forming a first groove and a second groove in a first protective layer along a scribe line, the first protective layer being formed over a multi-layer interconnect which is formed over one surface of a wafer, over which a plurality of element forming regions partitioned by a plurality of the scribe lines are formed, and each of the first groove and the second groove having a width less than that of the scribe line; forming a second protective film that fills the first groove and the second groove and covers the first protective film, over the first protective film; and forming a cutting groove that reaches at least a predetermined depth of the multi-layer interconnect by performing a laser dicing on a region between the first groove and the second groove along the scribe line from a surface where the second protective film is formed.

According to the above-mentioned structure, the first groove and the second groove are formed between a laser dicing region and an element forming region. Therefore, the thickness of the second protective film formed in the first groove and the second groove becomes large. In this way, the contact area between the second protective film and the first protective film in the first groove and the second groove is increased, and adhesion therebetween is improved. Therefore, even when the second protective film peels off in the cutting groove, it is possible to prevent the second protective film from further peeling off in the first groove and the second groove. In addition, the thickness of the second protective film in the first groove and the second groove is more than that of the second protective film in a region other than the grooves. That is, there is a difference in the thickness of the second protective film between the inside and the outside of the first groove and the second groove. Therefore, even when the second protective film peels off, stress is concentrated on the boundary where there is a difference in thickness and the second protective film is broken at the boundary. In this way, it is possible to prevent the second protective film from further peeling off. As a result, it is possible to prevent the adhesion of a scattered material caused by laser light to the element forming region.

Any combinations of the above-mentioned components and modifications of the method and apparatus according to the invention are also included in the scope of the invention.

According to the above-mentioned embodiment of the invention, it is possible to prevent the peeling of a protective film when laser dicing is performed to cut a multi-layer interconnect in order to divide a wafer into parts, thereby preventing the adhesion of contaminants to the wafer.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 6A and 6B are enlarged plan views illustrating a portion of the semiconductor device shown in FIG. 5;

DETAILED DESCRIPTION

Figure 1:
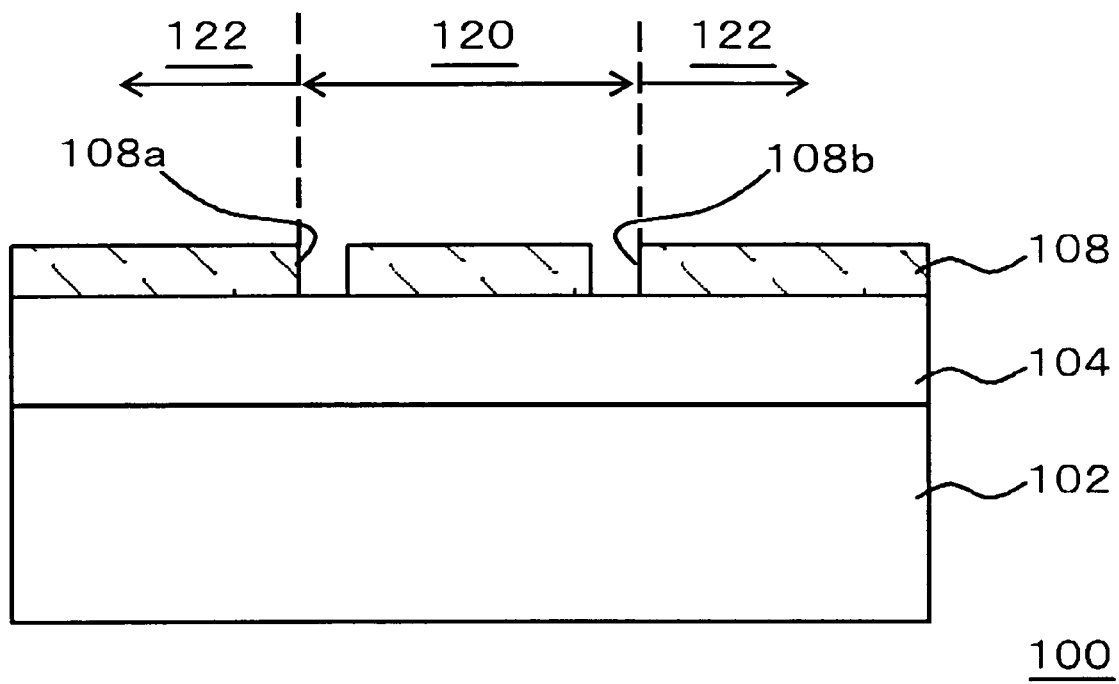
FIG. 1 is a cross-sectional view illustrating an example of the structure of a semiconductor device according to an embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Hereinafter, exemplary embodiments of the invention will be described with reference to the accompanying drawings. In the drawings, the same components are denoted by the same reference numerals and a description thereof will not be repeated.

FIG. 1 is a cross-sectional view illustrating the structure of a semiconductor device according to an embodiment of the invention. FIGS. 2A to 4B are cross-sectional views illustrating a process of manufacturing the semiconductor device according to this embodiment.

A semiconductor device 100 includes a wafer 102, a multi-layer interconnect 104 that is provided on one surface of the wafer 102, and a polyimide film 108 (first protective film) that is formed on the multi-layer interconnect 104. A plurality of element forming regions 122 partitioned by scribe lines 120 is formed on the wafer 102.

In this embodiment, a first groove 108a and a second groove 108b each having a width less than that of the scribe line 120 are formed in the polyimide film 108 along each of the scribe lines 120 (FIG. 1). For example, the first groove 108a and the second groove 108b may be formed by applying a polyimide material on the entire surface of the wafer 102 on which elements are formed and exposing and developing the polyimide material using a mask to pattern it. For example, when a negative photosensitive polyimide material is used as the polyimide material, a mask in which a region corresponding to the first groove 108a and the second groove 108b is a light shielding region may be used as the mask during the exposure of the polyimide material. For example, when a positive photosensitive polyimide material is used as the polyimide material, a mask in which the region corresponding to the first groove 108a and the second groove 108b is exposed may be used as the mask during the exposure of the polyimide material.

The width of the scribe line 120 may be, for example, about 100 μm. In addition, the thickness of the polyimide film 108 may be, for example, about 8 μm. The widths of the first groove 108a and the second groove 108b may be set to an aspect ratio that is enough for the first groove 108a and the second groove 108b to be filled with a laser dicing protective film 110. For example, the aspect ratio (depth/width) of the first groove 108a and the second groove 108b may be equal to or more than about 0.1 and equal to or less than about 2.5. Provided that the first groove 108a and the second groove 108b respectively has such the aspect ratio range, the first groove 108a and the second groove 108b may have the same width or different widths. In this embodiment, the first groove 108a and the second groove 108b have the same width.

Figure 5:
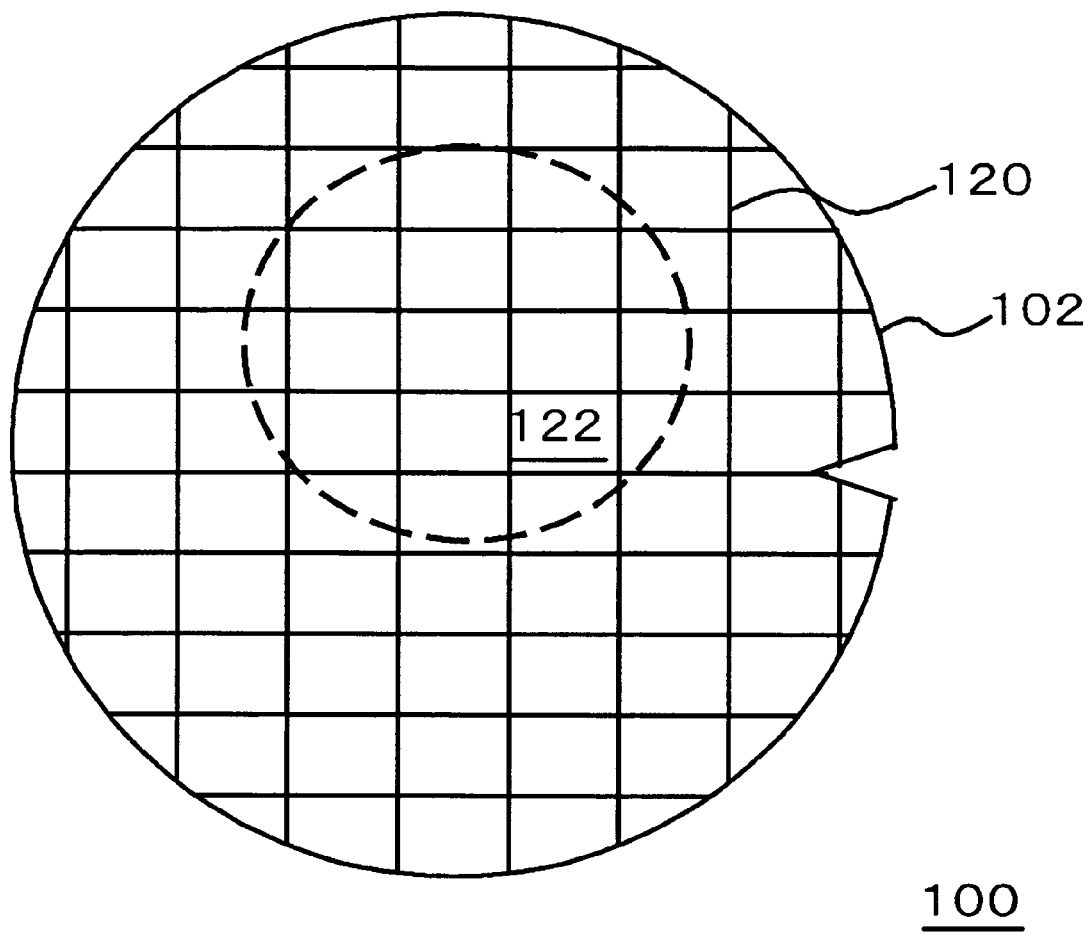
FIG. 5 is a plan view illustrating the structure of the semiconductor device according to the embodiment of the invention.

FIG. 5 and FIGS. 6A and 6B are plan views illustrating the structure of the semiconductor device 100 shown in FIG. 1. FIGS. 6A and 6B are enlarged plan views illustrating a portion of the semiconductor device surrounded by a dashed line in FIG. 5. FIG. 1 is a cross-sectional view taken along the line A-A' of FIG. 6A. In this embodiment, the first groove 108a and the second groove 108b are formed at the ends of the scribe line 120.

In this embodiment, the polyimide film 108 may remain on alignment marks 130 on the scribe lines 120 (FIG. 6A), or the polyimide film 108 formed on the alignment masks may be removed (FIG. 6B).

Figure 2A:
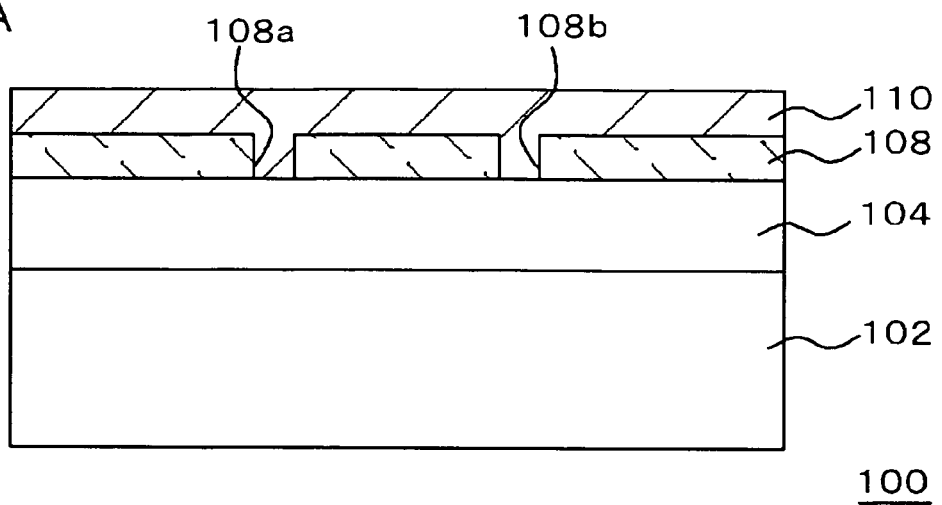
FIGS. 2A and 2B are cross-sectional views illustrating an example of a process of manufacturing the semiconductor device according to the embodiment of the invention.
Figure 2B:
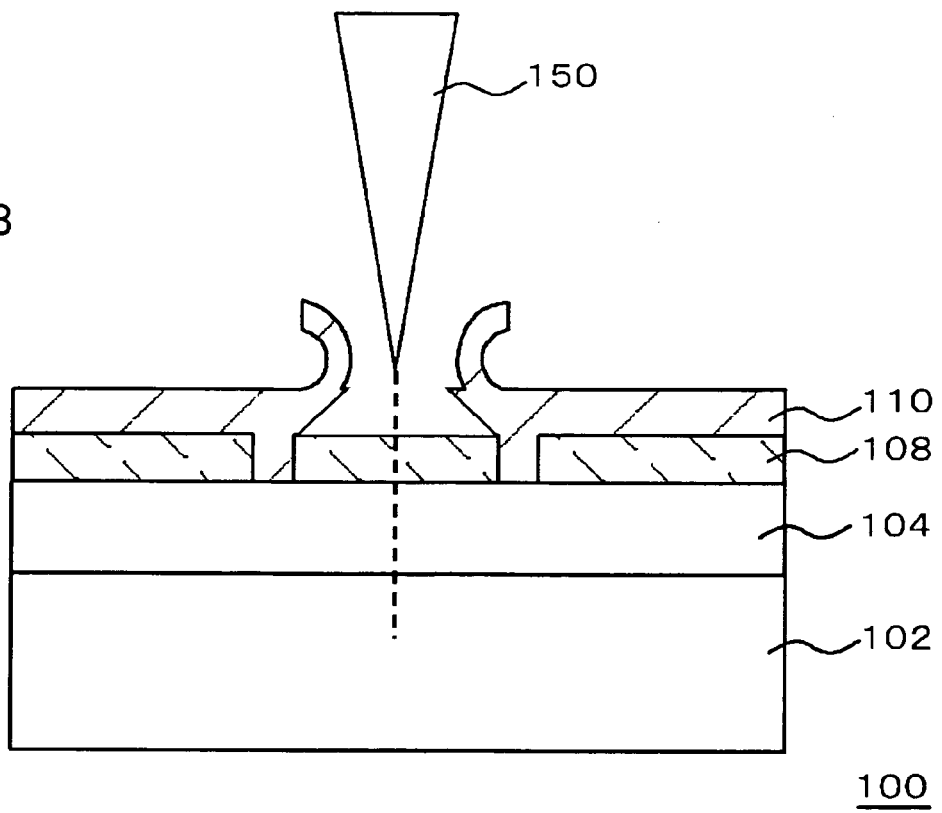

Referring to FIG. 2A, the laser dicing protective film 110 (second protective film) that fills the first groove 108a and the second groove 108b and covers the polyimide film 108 is formed on the entire surface of the wafer 102 (FIG. 2A). In this embodiment, the laser dicing protective film 110 may be, for example, a water-soluble film such as a polyvinyl alcohol film. The first groove 108a and the second groove 108b may be completely filled up with the laser dicing protective film 110. Alternatively, the first groove 108a and the second groove 108b may not be completely filled up with the laser dicing protective film 110 provided that the thickness of the laser dicing protective film 110 in the first groove 108a and the second groove 108b is more than that of a flat portion of the upper surface of the polyimide film 108. That is, in this embodiment, the term "the first groove 108a and the second groove 108b is filled with the laser dicing protective film 110" means a state in which the thickness of the laser dicing protective film 110 in the first groove 108a and the second groove 108b is more than that of the flat portion of the upper surface of the polyimide film 108, in addition to a state in which the first groove 108a and the second groove 108b are completely filled with the laser dicing protective film 110.

Figure 3A:
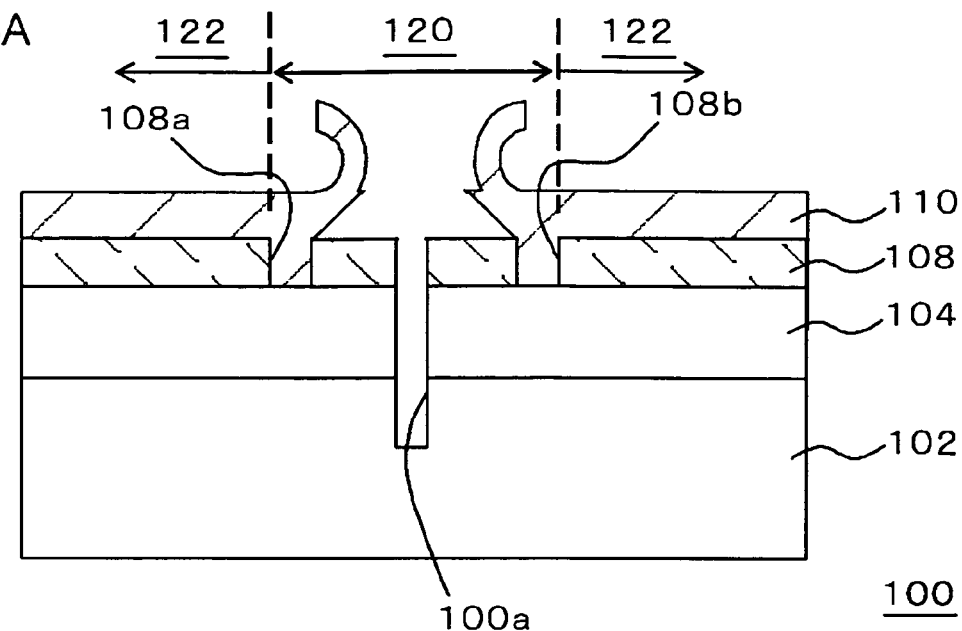
FIGS. 3A and 3B are cross-sectional views illustrating an example of the process of manufacturing the semiconductor device according to the embodiment of the invention.

Then, the laser light 150 is radiated to a region between the first groove 108a and the second groove 108b along the scribe line 120, when seen in a plan view from the surface where the laser dicing protective film 110 is formed (FIG. 2B), and a cutting groove 100a that reaches at least a predetermined depth of the multi-layer interconnect 104 through the laser dicing protective film 110 and the polyimide film 108 is formed by the laser dicing. In this embodiment, the multi-layer interconnect 104 may include as an insulating interlayer a low-dielectric-constant film, such as a SiOC film, with a relative dielectric constant smaller than that of $SiO_2$. The low-dielectric-constant film may be a porous film. In this embodiment, at least a layer where the porous film is formed is cut by the laser dicing. In the laser dicing, one scanning operation may be performed for each scribe line 120, or a plurality of scanning operations may be performed for each scribe line 120 to increase the width of the cutting groove 100a. In addition, a light shielding mask that covers portions other than the scribe lines 120 may be used in the laser dicing. In this embodiment, the multi-layer interconnect 104 and a portion of the wafer 102 may be cut by the laser dicing. That is, in this embodiment, the cutting groove 100a may be formed in the laser dicing protective film 110, the polyimide film 108, the multi-layer interconnect 104, and a portion of the upper surface of the wafer 102 (FIG. 3A).

Figure 3B:
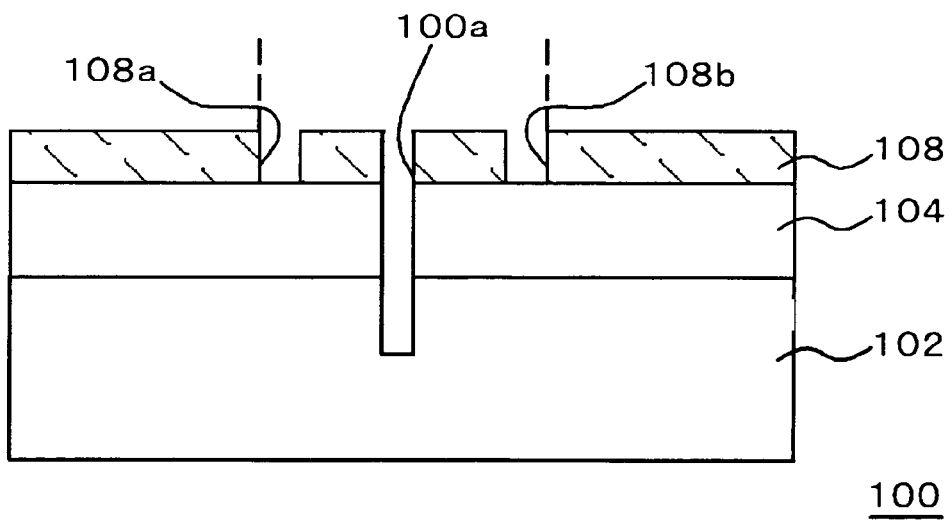

In this embodiment, even when the laser dicing protective film 110 peels off during the laser dicing, the peeling of the laser dicing protective film 110 is not spread to the element forming region 122 since the thickness of the laser dicing protective film 110 formed in the first groove 108a and the second groove 108b is large, and it is possible to prevent the adhesion of a scattered material to the element forming region 122 during the laser machining. Then, the surface of the semiconductor device 100 is cleaned by a cleaning solution, such as pure water, and the laser dicing protective film 110 is removed (FIG. 3B).

Figure 4A:
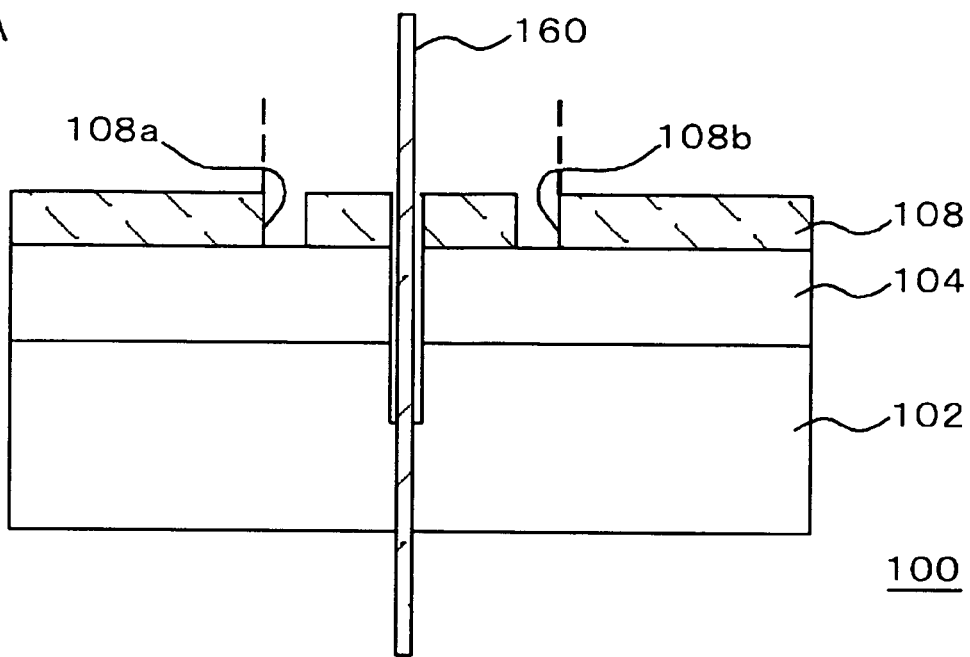
FIGS. 4A and 4B are cross-sectional views illustrating an example of the process of manufacturing the semiconductor device according to the embodiment of the invention.
Figure 4B:
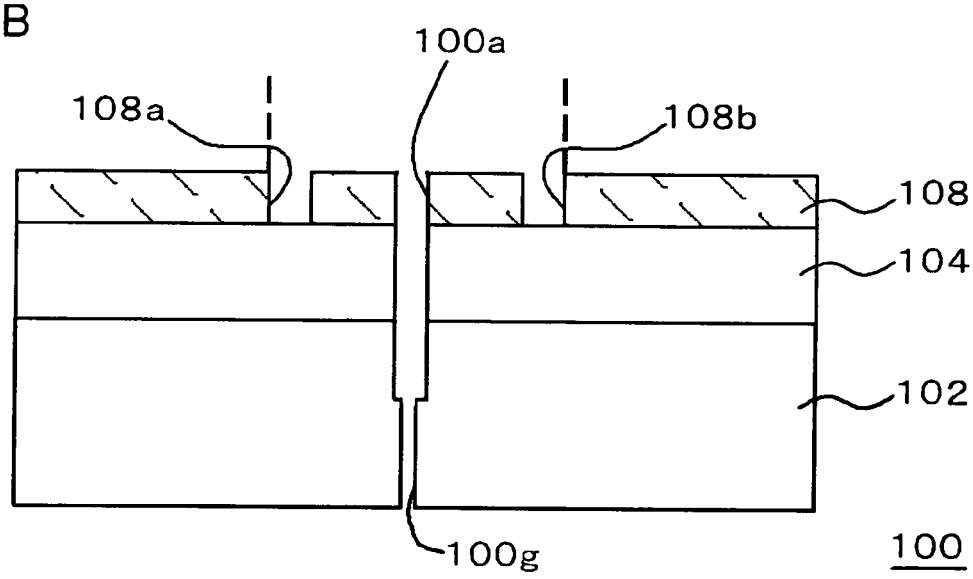

Then, blade dicing is performed to cut the wafer 102 with a dicing blade 160 along the scribe lines 120 from the surface of the wafer 102 (FIG. 4A). In this embodiment, the width of the dicing blade 160 is less than the width between the outer ends of the cutting groove 100a. In this way, cutting grooves 100g having a width less than that of the cutting groove 100a is formed in the wafer 102 and the semiconductor device 100 is divided into parts along the cutting grooves 100a (FIG. 4B). In this way, the semiconductor device 100 is divided into semiconductor chips each including each of the element forming regions 122. According to this structure, during the blade dicing, the edge of the dicing blade 160 does not come into contact with the multi-layer interconnect 104 provided outside the scribe line 120. Therefore, even when a porous film is included in the multi-layer interconnect 104, it is possible to prevent the porous film with a low quality from being damaged.

Next, the effects of a method of manufacturing the semiconductor device 100 according to this embodiment will be described.

In this embodiment, the first groove 108a and the second groove 108b are respectively formed between a region where the laser dicing is performed and the element forming region 122. The thickness of the laser dicing protective film 110 formed in the first groove 108a and the second groove 108b becomes large. In this way, the contact area between the laser dicing protective film 110 and the polyimide film 108 in the first groove 108a and the second groove 108b is increased, and adhesion therebetween is improved. Therefore, even when the laser dicing protective film 110 peels off in the cutting groove 100a, it is possible to prevent the peeling of the laser dicing protective film 110 in the first groove 108a and the second groove 108b. In addition, the thickness of the laser dicing protective film 110 in the first groove 108a and the second groove 108b is more than that of the laser dicing protective film 110 in a region other than the grooves. That is, there is a difference in the thickness of the laser dicing protective film 110 between the inside and the outside of the first groove 108a and the second groove 108b. Therefore, even when the laser dicing protective film 110 peels off, stress is concentrated on the boundary where there is a difference in thickness and the laser dicing protective film 110 is broken at the boundary. In this way, it is possible to prevent the laser dicing protective film 110 from further peeling off. As a result, it is possible to prevent the adhesion of a scattered material caused by laser light to an element in the element forming region 122.

In this embodiment, the polyimide film 108 is formed on the scribe line 120, and the grooves (the first groove 108a and the second groove 108b) each having a width smaller than that of the scribe line 120 is formed in a portion of the polyimide film 108. Therefore, it is possible to fill the first groove 108a and the second groove 108b with the laser dicing protective film 110 and improve the flatness of the surface of the laser dicing protective film 110. In this way, it is possible to planarize a surface irradiated with the laser light 150 and thus improve laser machining quality.

In this embodiment, the polyimide film 108 may be formed in the scribe line 120, and the polyimide film 108 may be exposed from the side of a chip divided from the semiconductor device. The polyimide film 108 is made of an insulating material. Therefore, even when the edge of the divided chip comes into contact with a bonding wire, it is possible to prevent a short circuit, which results in an increase in yield. In addition, the adhesion between the edge of the chip and a sealing resin or an underfill resin is improved, which results in an increase in reliability.

Other Embodiments

The invention is not limited to the above-described embodiment. For example, the first groove 108a and the second groove 108b may be arranged in various ways as long as they are respectively provided between the region where the laser light 150 is irradiated and laser dicing is performed in the subsequent process, and the element forming region 122.

Figure 7A:
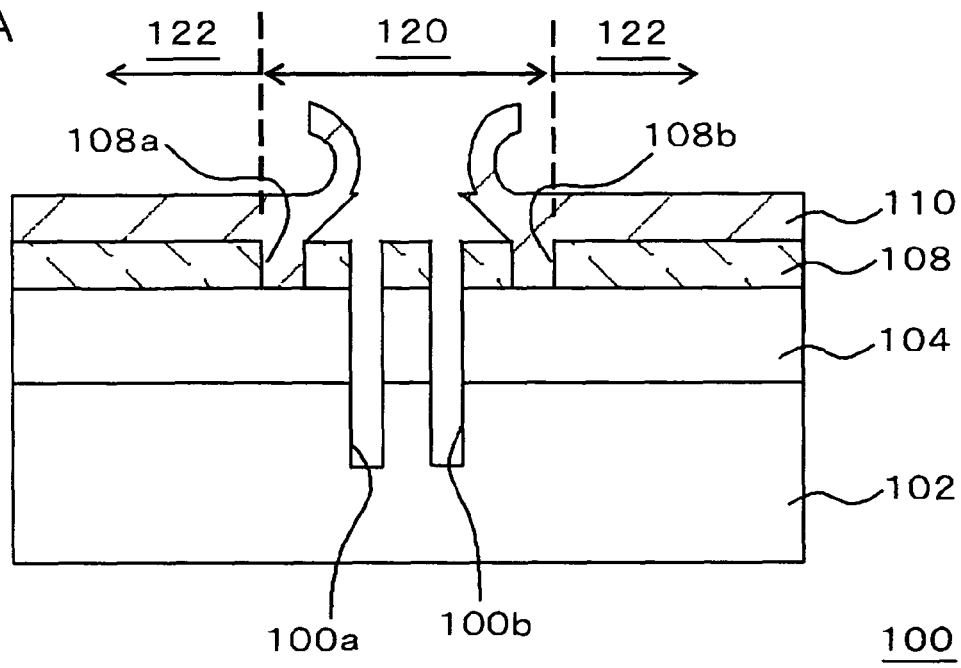
FIGS. 7A and 7B are cross-sectional views illustrating another example of the process of manufacturing the semiconductor device according to the embodiment of the invention.
Figure 7B:
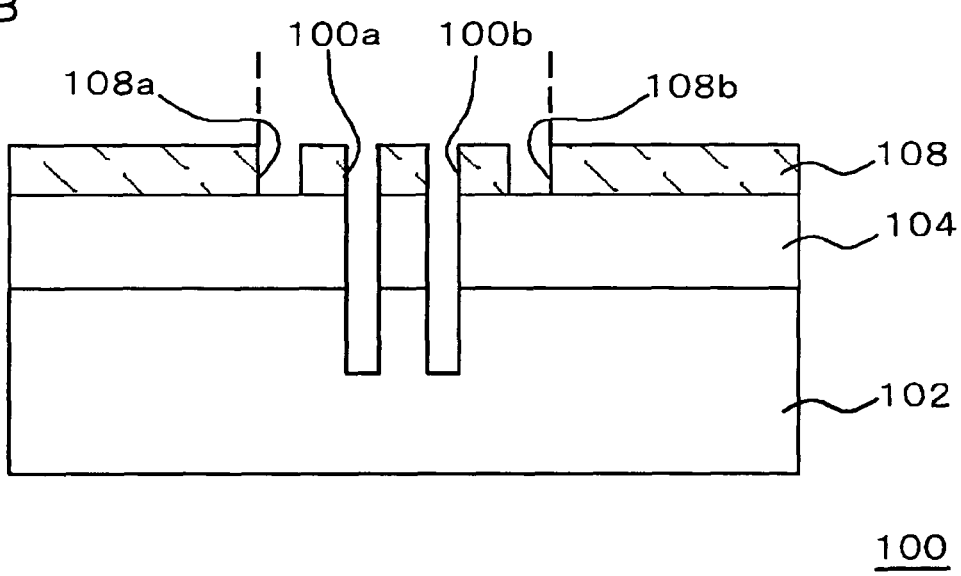
Figure 8A:
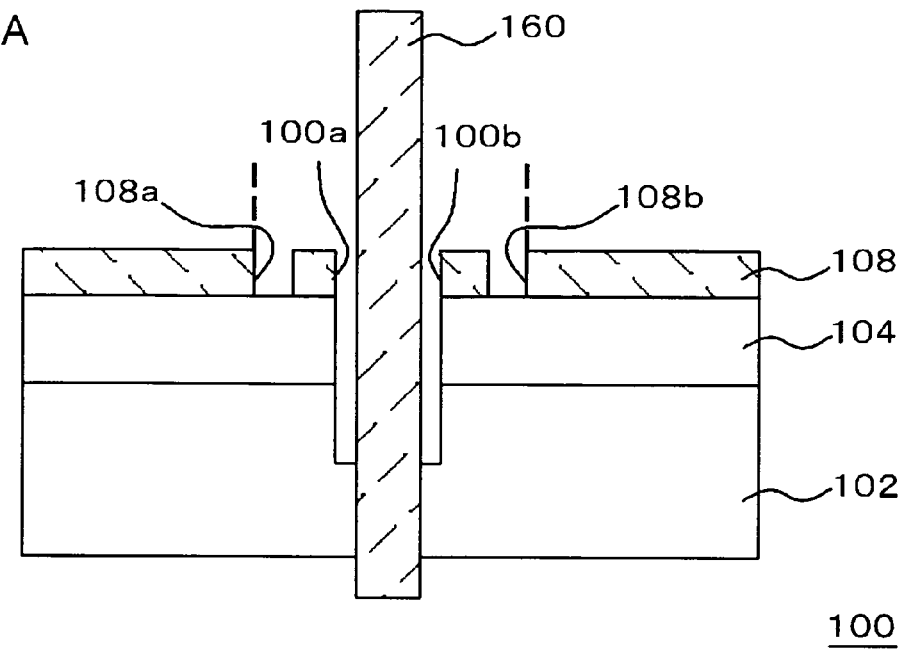
FIGS. 8A and 8B are cross-sectional views illustrating another example of the process of manufacturing the semiconductor device according to the embodiment of the invention.
Figure 8B:
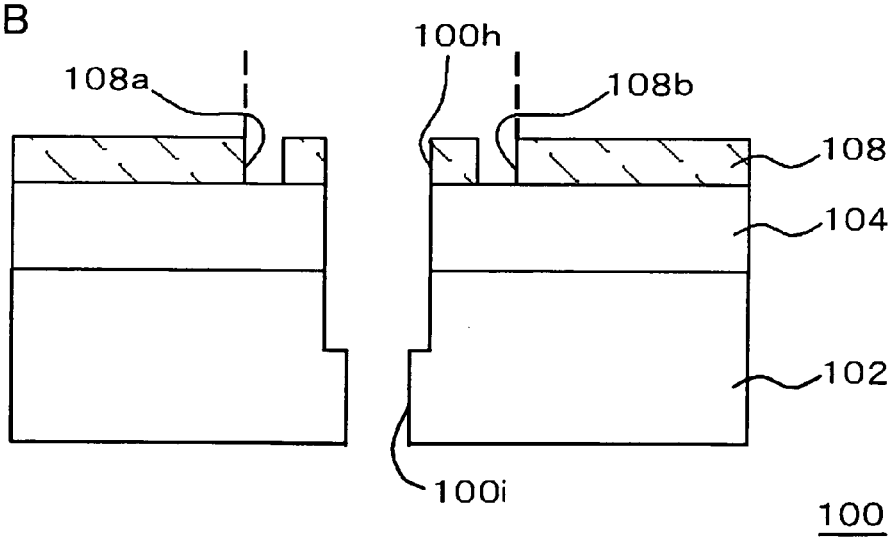

For example, as shown in FIGS. 7A and 7B, a plurality of cutting grooves (the cutting groove 100a and the cutting groove 100b) may be formed between the first groove 108a and the second groove 108b by laser dicing. In this case, after the cutting groove 100a and the cutting groove 100b are formed, blade dicing is performed to cut the wafer 102 along the scribe lines 120 with the dicing blade 160 from the surface of the wafer 102 (FIG. 8A). In this example, the width of the dicing blade 160 is more than that of the region between the cutting groove 100a and the cutting groove 100b and is less than the width between the outer end of the cutting groove 100a that is away from the cutting groove 100b and the outer end of the cutting groove 100b that is away from the cutting groove 100a. In this way, a cutting groove 100h defined by the width between the outer end of the cutting groove 100a and the outer end of the cutting groove 100b is formed in the polyimide film 108 or the multi-layer interconnect 104 by blade dicing using the dicing blade 160, and a cutting groove 100i having a width less than the width between the outer end of the cutting groove 100a and the outer end of the cutting groove 100b is formed in the wafer 102. The semiconductor device 100 is divided into parts by the cutting grooves 100h and 100i (FIG. 8B). In this way, the semiconductor device 100 is divided into semiconductor chips each including the element forming region 122. According to this structure, during blade dicing, the edge of the dicing blade 160 does not come into contact with the multi-layer interconnect 104 provided outside the scribe line 120. Therefore, even when a porous film is included in the multi-layer interconnect 104, it is possible to prevent the porous film with a low quality from being damaged.

FIGS. 9A and 9B and FIGS. 10A and 10B are cross-sectional views illustrating another example of the grooves formed in the polyimide film 108.

Figure 9A:
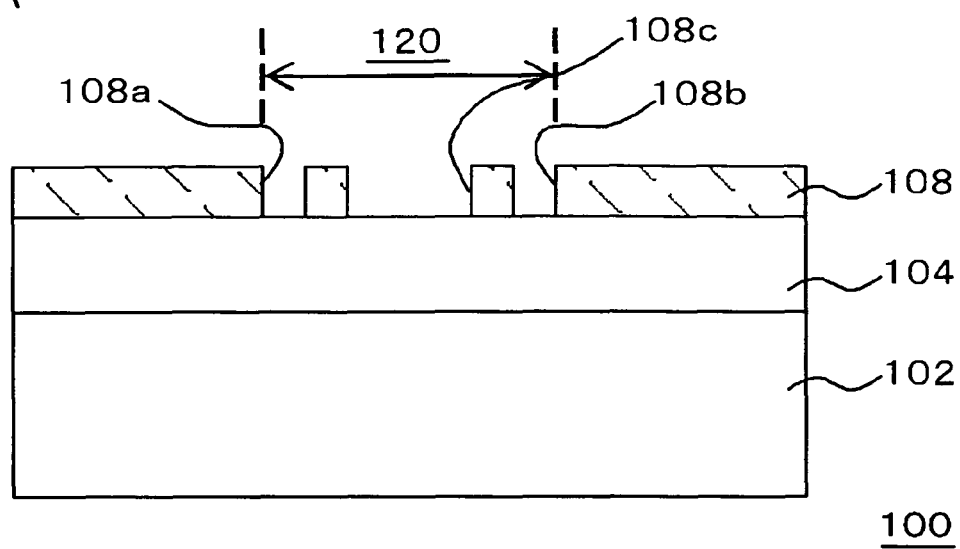
FIGS. 9A and 9B are cross-sectional views illustrating another example of the structure of a step of the process of manufacturing the semiconductor device according to the embodiment of the invention.

For example, as shown in FIG. 9A, a groove 108c may be formed in a region between the first groove 108a and the second groove 108b. The width of the groove 108c may be more than that of the first groove 108a or the second groove 108b. In this structure, when the laser dicing protective film 110 is formed on the polyimide film 108, the first groove 108a and the second groove 108b are filled with the laser dicing protective film 110. Therefore, the same effects as those in the structure described with reference to FIGS. 1 to 6B are obtained.

Figure 9B:
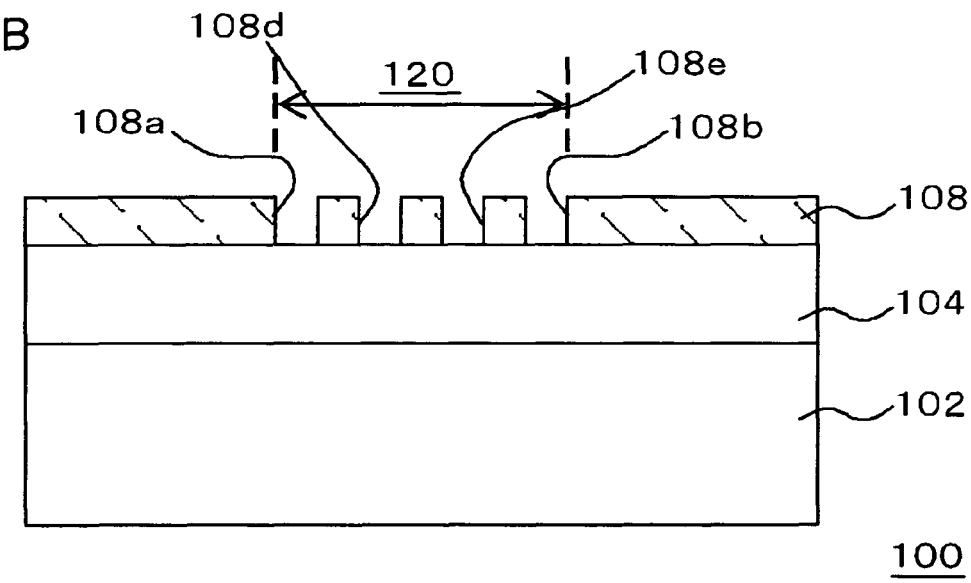

For example, as shown in FIG. 9B, a groove 108d and a groove 108e may be provided in the region between the first groove 108a and the second groove 108b. The groove 108d and the groove 108e may have the same width as the first groove 108a or the second groove 108b. In this structure, when the laser dicing protective film 110 is formed on the polyimide film 108, the first groove 108a and the second groove 108b are filled with the laser dicing protective film 110. Therefore, the same effects as those in the structure described with reference to FIGS. 1 to 6B are obtained. In addition, since the groove 108d and the groove 108e are also filled with the laser dicing protective film 110, it is possible to effectively prevent the peeling of the laser dicing protective film 110.

Figure 10A:
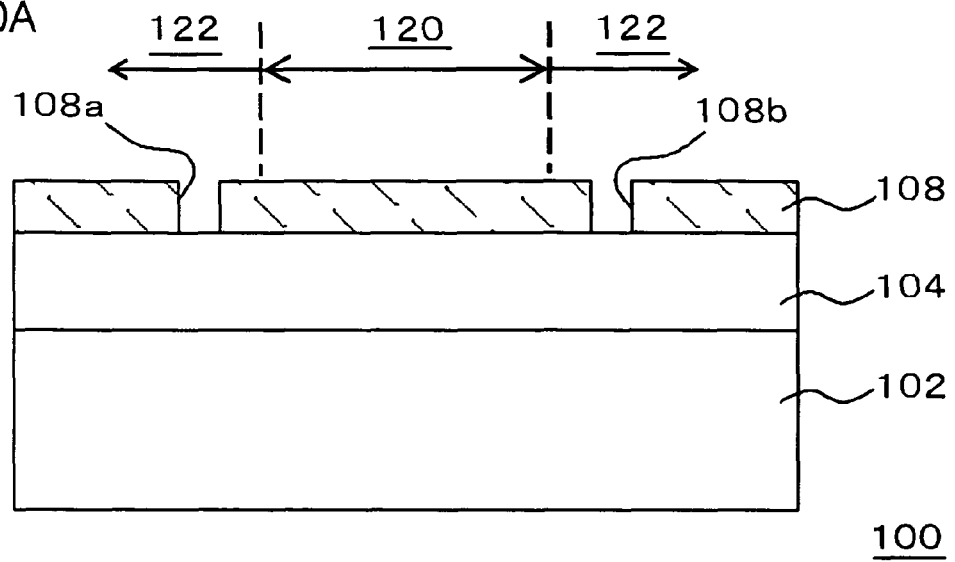
FIGS. 10A and 10B are cross-sectional views illustrating another example of the structure of a step of the process of manufacturing the semiconductor device according to the embodiment of the invention.

For example, as shown in FIG. 10A, the first groove 108a and the second groove 108b may be formed in a portion of the element forming region 122 close to the scribe line 120. In this structure, the first groove 108a and the second groove 108b may be respectively arranged between the scribe line 120 and the region in which an element causing a problem by the adhesion of a scattered material due to laser light is formed. Therefore, it is possible to prevent the influence of the adhesion of a scattered material caused by laser light on the element.

Figure 10B:
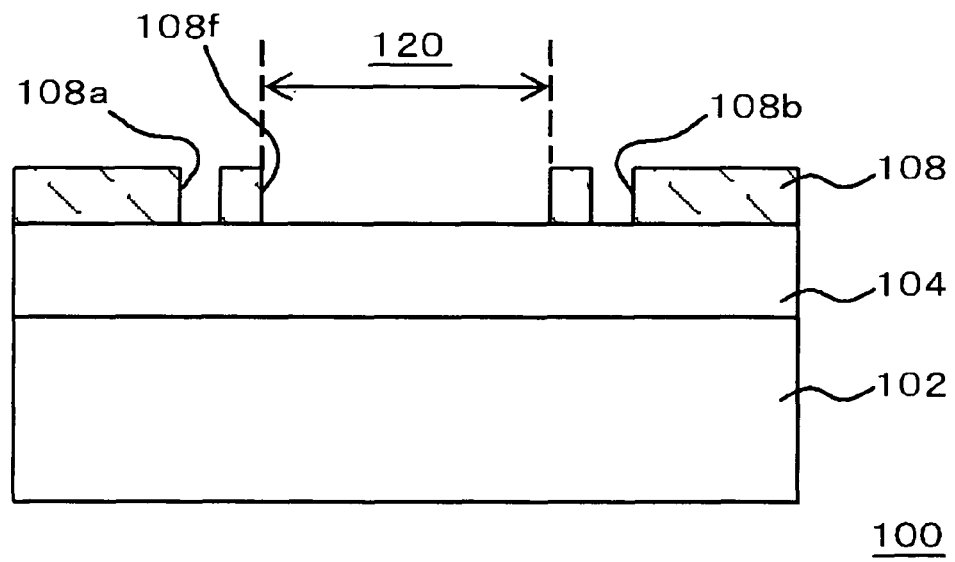
Figure 11A:
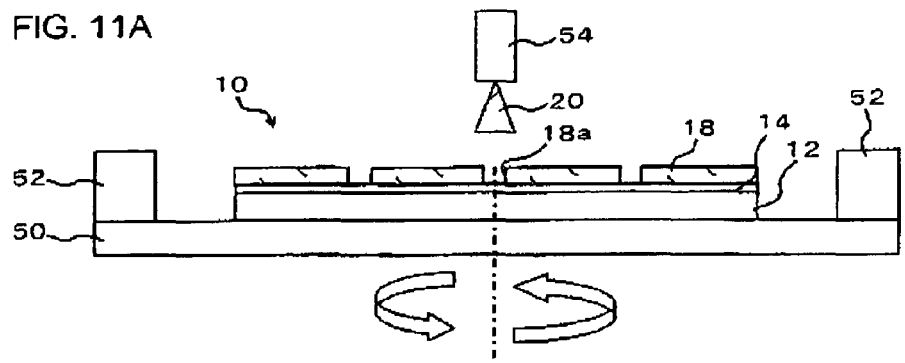
FIGS. 11A to 11C are cross-sectional views illustrating the problems of a semiconductor device according to the related art.
Figure 11B:
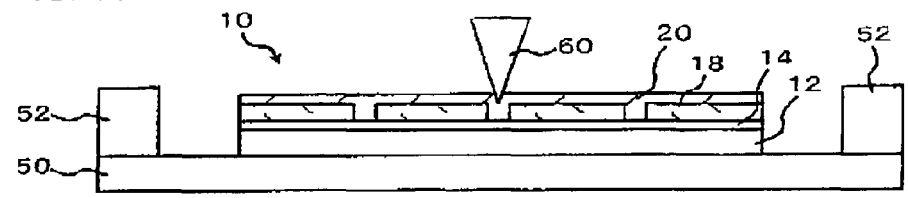
Figure 11C:
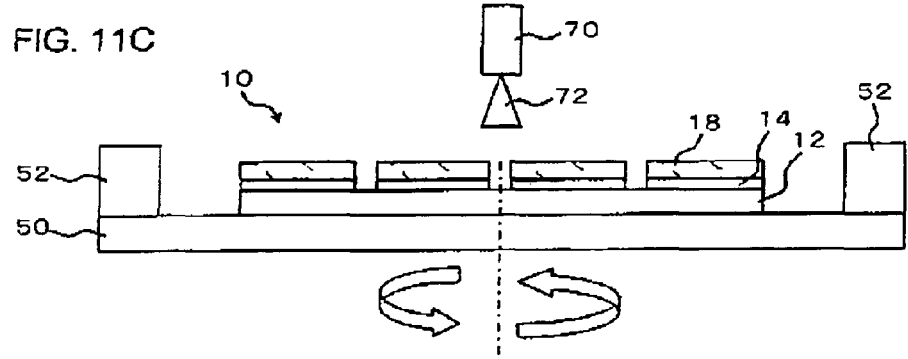
Figure 12A:
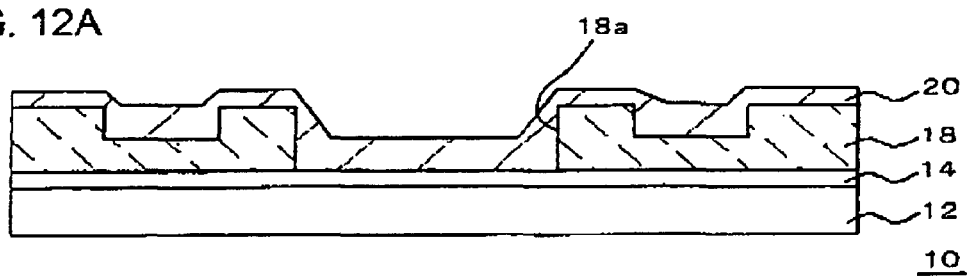
FIGS. 12A to 12C are cross-sectional views illustrating the problems of the semiconductor device according to the related art.
Figure 12B:
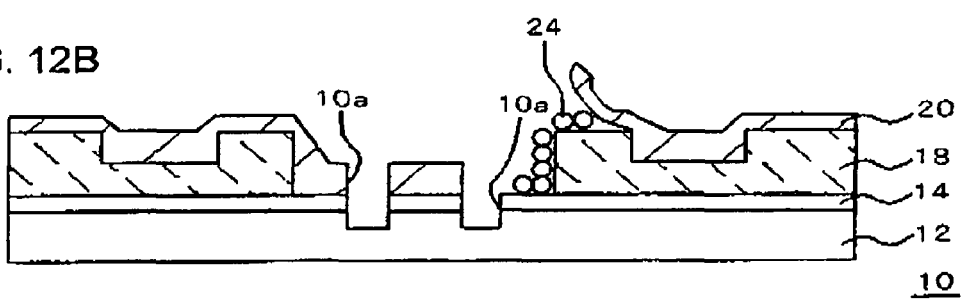
Figure 12C:
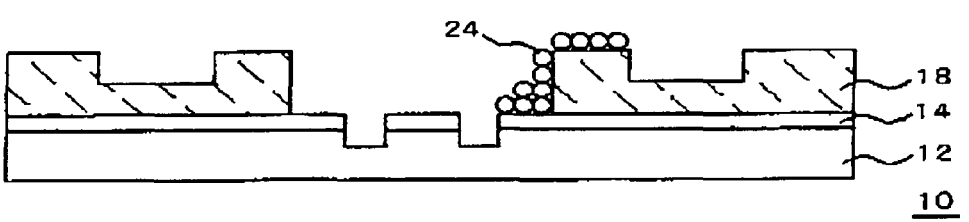

For example, as shown in FIG. 10B, the first groove 108a and the second groove 108b may be formed similar to that shown in FIG. 10A but the polyimide film 108 in the scribe line 120 may be removed to form a groove 108f. In this structure, when the laser dicing protective film 110 is formed on the polyimide film 108, there is a concern that laser dicing protective film 110 is not filled in the scribe line 120, similar to the related art. However, in this structure, the first groove 108a and the second groove 108b may be respectively arranged between the scribe line 120 and the region in which an element causing a problem by the adhesion of a scattered material due to laser light is formed. Therefore, it is possible to prevent the influence of the adhesion of a scattered material caused by laser light on the element.

The embodiments of the invention have been described with reference to the drawings, but the invention is not limited thereto. Various structures other than the above may be used.

It is apparent that the present invention is not limited to the above embodiment, and may be modified and changed without departing from the scope and spirit of the invention.

What is claimed is:
1. A method of manufacturing a semiconductor device, the method comprising:

forming a first groove and a second groove in a first protective layer along a scribe line, said first protective layer being formed over a multi-layer interconnect which is formed over one surface of a wafer, over which a plurality of element forming regions partitioned by a plurality of said scribe lines are formed, and each of said first groove and said second groove comprising a width less than that of said scribe line;

forming a second protective film that fills said first groove and said second groove and covers said first protective film, over said first protective film; and forming a cutting groove that reaches at least a predetermined depth of said multi-layer interconnect by performing a laser dicing on a region between said first groove and said second groove along said scribe line from a surface where said second protective film is formed.

2. The method of manufacturing a semiconductor device as set forth in claim 1, wherein said multi-layer interconnect includes a low-dielectric-constant film having a relative dielectric constant smaller than that of $SiO_2$, and wherein, in said forming said cutting groove, said cutting groove is formed such that at least said low-dielectric-constant film of said multi-layer interconnect is cut by the laser dicing.

3. The method of manufacturing a semiconductor device as set forth in claim 2, wherein said low-dielectric-constant film comprises a porous film.

4. The method of manufacturing a semiconductor device as set forth in claim 1, wherein, in said forming said cutting groove, said cutting groove is formed to at least a predetermined depth of said wafer by the laser dicing.

5. The method of manufacturing a semiconductor device as set forth in claim 1, wherein an aspect ratio (depth/width) of each of said first groove and said second groove is equal to or more than 0.1 and equal to or less than 2.5.

6. The method of manufacturing a semiconductor device as set forth in claim 1, wherein said first protective film comprises a polyimide film.

7. The method of manufacturing a semiconductor device as set forth in claim 1, wherein, in said forming said first groove and said second groove, said first groove and said second groove are formed over said scribe line.

8. The method of manufacturing a semiconductor device as set forth in claim 1, further comprising cutting said wafer into parts each including each of said plurality of element forming regions with a dicing blade along said plurality of scribe lines after said forming said cutting groove, wherein the width of said dicing blade is less than a width between the outer ends of said cutting groove.

9. A method of manufacturing a semiconductor device, comprising:

preparing a wafer comprising:
a multi-layer interconnect formed over one surface of said wafer;
a first protective layer formed over said multi-layer interconnect;
a first groove and a second groove provided in said first protective layer along a scribe line, said first groove and second groove having a width less than a width of said scribe line; and
a plurality of element forming regions partitioned by a plurality of said scribe lines;

forming a second protective film that fills said first groove and said second groove and covers said first protective film, over said first protective film; and forming a cutting groove that reaches at least a predetermined depth of said multi-layer interconnect by performing a laser dicing on a region between said first groove and said second groove along said scribe line from a surface where said second protective film is formed.

10. The method of manufacturing a semiconductor device as set forth in claim 9, wherein said multi-layer interconnect includes a low-dielectric-constant film having a relative dielectric constant smaller than that of $SiO_2$, and in said forming said cutting groove, said cutting groove is formed such that at least said low-dielectric-constant film of said multi-layer interconnect is cut by the laser dicing.

11. The method of manufacturing a semiconductor device as set forth in claim 10, wherein said low-dielectric-constant film comprises a porous film.

12. The method of manufacturing a semiconductor device as set forth in claim 9, wherein, in said forming said cutting groove, said cutting groove is formed to at least a predetermined depth of said wafer by the laser dicing.

13. The method of manufacturing a semiconductor device as set forth in claim 9, wherein an aspect ratio (depth/width) of each of said first groove and said second groove is equal to or more than 0.1 and equal to or less than 2.5.

14. The method of manufacturing a semiconductor device as set forth in claim 9, wherein said first protective film comprises a polyimide film.

15. The method of manufacturing a semiconductor device as set forth in claim 9, wherein, in said forming said first groove and said second groove, said first groove and said second groove are formed over said scribe line.

16. The method of manufacturing a semiconductor device as set forth in claim 9, further comprising cutting said wafer into parts each including each of said plurality of element forming regions with a dicing blade along said plurality of scribe lines after said forming said cutting groove, wherein the width of said dicing blade is less than a width between the outer ends of said cutting groove.

17. The method of manufacturing a semiconductor device as set forth in claim 9, wherein said scribe lines comprise a first scribe line and a second scribe line, said first scribe line and said second scribe line crossing each other, wherein said first groove is formed along said first scribe line, said wafer comprising a third groove in said first protective layer along said second scribe line, said third groove having a width that is less than a width of said second scribe line, and wherein said first groove and said third groove cross each other.

* * * * *